United States Patent
Hui et al.

(10) Patent No.: US 9,901,895 B2
(45) Date of Patent: Feb. 27, 2018

(54) METHOD OF MARKING MATERIAL AND SYSTEM THEREFORE, AND MATERIAL MARKED ACCORDING TO SAME METHOD

(71) Applicant: Chow Tai Fook Jewellery Company Limited, Central (HK)

(72) Inventors: Koon Chung Hui, Tseung Kwan O (HK); Ho Ching, Kowloon (HK); Ching Tom Kong, New Territories (HK)

(73) Assignee: Chow Tai Fook Jewellery Company (HK)

( * ) Notice: Subject to any disclaimer, the term of this patent is extended or adjusted under 35 U.S.C. 154(b) by 519 days.

(21) Appl. No.: 14/290,369

(22) Filed: May 29, 2014

(65) Prior Publication Data
US 2014/0356577 A1    Dec. 4, 2014

(30) Foreign Application Priority Data

May 30, 2013    (HK) .................................. 13106425

(51) Int. Cl.
*B44C 1/22*    (2006.01)
*B01J 19/08*   (2006.01)
(Continued)

(52) U.S. Cl.
CPC ............. *B01J 19/081* (2013.01); *C30B 29/04* (2013.01); *C30B 33/04* (2013.01); *H01J 37/00* (2013.01);
(Continued)

(58) Field of Classification Search
CPC ........ B01J 19/081; C30B 29/04; C30B 33/04; H01J 37/00
(Continued)

(56) References Cited

U.S. PATENT DOCUMENTS 4,184,079 A    1/1980   Hudson et al.
4,467,172 A    8/1984   Ehrenwald et al.
(Continued)

FOREIGN PATENT DOCUMENTS

CN        1896315 A      1/2007
CN     101456534 A       6/2009
(Continued)

OTHER PUBLICATIONS

The Rayleigh Criterion, via http://hyperphysics.phy-astr.gsu.edu/hbase/phyopt/Raylei.html ; 3 pages; No date available.*
(Continued)

*Primary Examiner* — Binh X Tran
(74) *Attorney, Agent, or Firm* — Kolisch Hartwell, P.C.

(57) ABSTRACT

A method of forming one or more protrusions on an outer surface of a polished face of a solid state material, said method including the step of applying focused inert gas ion beam local irradiation towards an outer surface of a polished facet of a solid state material in a way of protruding top surface material; wherein irradiated focused inert gas ions from said focused inert gas ion bean penetrate the outer surface of said polished facet of said solid state material; and wherein irradiated focused inert gas ions cause expansive strain within the solid state crystal lattice of the solid state material below said outer surface at a pressure so as to induce expansion of solid state crystal lattice, and form a protrusion on the outer surface of the polished face of said solid state material.

16 Claims, 10 Drawing Sheets

(51) Int. Cl.
*C30B 29/04* (2006.01)
*H01J 37/00* (2006.01)
*C30B 33/04* (2006.01)
C30B 29/16 (2006.01)
C30B 29/20 (2006.01)
C30B 29/34 (2006.01)
B41M 3/14 (2006.01)

(52) U.S. Cl.
CPC ............... *B41M 3/14* (2013.01); *C30B 29/16* (2013.01); *C30B 29/20* (2013.01); *C30B 29/34* (2013.01); *Y10T 428/24355* (2015.01)

(58) Field of Classification Search
USPC .............................................. 216/66, 74, 81
See application file for complete search history.

(56) References Cited

U.S. PATENT DOCUMENTS

| | | | | |
|---|---|---|---|---|
| 5,702,586 | A | * | 12/1997 | Pehrsson .................. C25F 3/02 205/640 |
| 5,753,887 | A | | 5/1998 | Rosenwasser et al. |
| 6,391,215 | B1 | * | 5/2002 | Smith ...................... B44B 7/00 204/192.1 |
| 2004/0067346 | A1 | | 4/2004 | Hofmann et al. |
| 2006/0196858 | A1 | | 9/2006 | Barron et al. |
| 2010/0294930 | A1 | | 11/2010 | Preikszas et al. |
| 2012/0264237 | A1 | * | 10/2012 | Shearn ............. H01L 21/30608 438/8 |

FOREIGN PATENT DOCUMENTS

| | | |
|---|---|---|
| EP | 1391841 A1 | 2/2004 |
| EP | 2144117 A1 | 1/2010 |
| GB | 2047215 A | 11/1980 |
| GB | 2248575 A | 4/1992 |
| GB | 2332651 A | 6/1999 |
| WO | 9209876 A2 | 6/1992 |

OTHER PUBLICATIONS

Wikipedia, "Order of Magnitude" via https://en.wikipedia.org/wiki/Order_of_magnitude ; 8 pages; No date.*

O'Sullivan, Conor, Formalities Officer, European Patent Office, "Communication Pursuant to Article 94(3) EPC)" (examination report) in connection with related European Patent Application No. 14163895.7, dated Mar. 24, 2016, 5 pages.

European Patent Office, "European Search Report" in connection with related European Patent App. No. 14163895.7-1704, dated Jul. 24, 2014, 5 pages.

Dong Meng, Authorized Officer, State Intellectual Property Office of the P.R. China, "International Search Report" in connection with related PCT Patent App. No. PCT/CN2014/074438, dated Jul. 4, 2014, 7 pages.

Dong Meng, Authorized Officer, State Intellectual Property Office of the P.R. China, "Written Opinion of the International Searching Authority" in connection with related PCT Patent App. No. PCT/CN2014/074438, dated Jul. 4, 2014, 7 pages.

Carter. G. et al., "An STM Study of Atomically-Flat Gold Surfaces Irradiated with Energetic Helium and Argon Ions", Ninth international conference on ion beam modification of materials, Feb. 5-10, 1995, vol. 28, No. 24, p. 07017.

Liu, Yuanjun (Dr), Authorized Officer, Intellectual Property Office of Singapore, "Written Opinion" in connection with related Application No. 11201509479W, Aug. 4, 2016, 6 pages.

Was, Gary S., "10.5 solid phases and inert gas bubble latices". Fundamentals of Radiation Materials Science: Metals and Alloys, Jul. 14, 2007, pp. 535-537.

UKIPO, Search Report in connection with related Hong Kong Patent App. No. 13106425.7, dated Oct. 25, 2013, 2 pages.

* cited by examiner

METHOD OF MARKING MATERIAL AND SYSTEM THEREFORE, AND MATERIAL MARKED ACCORDING TO SAME METHOD

FIELD OF THE INVENTION

The present invention relates to a method of providing a marking on a solid state material. In particular, the present invention relates to providing a marking on a surface of a solid state material such as a gemstone or the like, whereby the marking is not optically viewable.

BACKGROUND OF THE INVENTION

Marking of solid materials, in particular precious gemstones or the like, may be required for example in identification or quality markings. For the marking of gemstones, it is desirable that marking be performed in a manner such that the gemstone is not damaged or any damage is minimised, the integrity of the gemstone is preserved, no significant loss in mass occurs, no chemical residue remains, and the marking does not detract from the clarity or colour of the gemstone.

For ornamental gemstones, the marking technique should not be visible to the naked eye so as not to detract from the quality of the stone from an aesthetic standpoint, whereby visible identification of marking may detract from the visual result in devaluation of a gemstone.

The techniques of etching, engraving and micro-milling processes exist in the prior art, which may impact on the integrity and quality of a gemstone, and may be viewed unfavourably. Furthermore, such processes result in some amount of loss of material, again which may be viewed unfavourably.

Other marking techniques exist within the prior art including those such as disclosed in U.S. Pat. No. 6,391,215B1, whereby an information mark is applied to a polished facet of a diamond or silicon carbide gemstone whereby the gemstone is coated with an electrically conductive layer. The electrically conductive layer prevents the gemstone from becoming charged and the mark is formed by a focused ion beam whereby a portion of the surface is ablated to a requisite depth, and whereby the surface to which the mark is applied is subsequently cleaned utilising a powerful oxidizing agent.

OBJECT OF THE INVENTION

Accordingly, it is an object of the present invention to provide a method of providing a marking on a solid state material and a solid state material having said marking thereon, which overcomes or at least partly ameliorates at least some of the deficiencies as associated with the prior art.

SUMMARY OF THE INVENTION

In a first aspect, the present invention provides a method of forming one or more protrusions on an outer surface of a polished facet of a solid state material, said method including the step of:

(i) applying focused inert gas ion beam local irradiation towards an outer surface of a polished facet of a solid state material in a way of protruding top surface material;

wherein irradiated focused inert gas ions from said focused inert gas ion beam penetrate the outer surface of said polished facet of said solid state material; and wherein irradiated focused inert gas ions cause expansive strain within the solid state crystal lattice of the solid state material below said outer surface at a pressure so as to induce expansion of solid state crystal lattice, and form a protrusion on the outer surface of the polished facet of said solid state material.

Preferably, the focused inert gas ion beam has a beam energy in the range of from 5 keV to 50 keV and probe current in the range of 1 fA to 200 pA.

The solid state crystal lattice may be in the form of a single crystalline, poly-crystalline, or amorphous form, and the solid state material is a material in solid state form under ambient temperature and under a pressure from atmospheric to high vacuum.

Preferably the solid state material is a precious stone. More preferably, the solid state material is a material selected from the group including Diamond, Ruby, Sapphire, Emerald, Pearl, Jade or the like.

The focused inert gas ion beam is an ion source which may be selected from any inert gas in Group VIII of the periodic table.

Preferably, the polished facet of the solid state material has an average surface roughness of less than 50 nm.

Preferably, the protrusion has an average width in the nanometer or micrometer order of magnitude, and an average height in the nanometer or micrometer order of magnitude.

The distance from the outer surface of said solid state material to the region of irradiated inert gas accumulation below the outer surface is preferably in the range of from 1 nm to 100 μm.

The protrusion may be provided so as to form an identifiable mark or pattern, and the identifiable mark is in the form of a single or array of dot, pillar, dome, hemisphere, line, irregular shape, symmetric or asymmetric shape, or the like.

The identifiable mark may be provided as a periodic line array, hole/dot array, circular array, spiral array, fractal array or multiple periods array, or the like.

Alternatively, the identifiable mark may be provided as a continuous protruded shape to form arbitrary patterns.

A plurality of protrusions may be formed that are nanometer sized so as to provide an information mark invisible to the naked eye due to Rayleigh Criterion in optical limit. The protrusions may be arranged in a periodic array viewable by specified lighting conditions and by a camera equipped microscope in the visible and invisible light range. The one or more protrusions forms an identifiable security mark.

The method preferably maintains integrity of said solid state material such that there exists substantially no loss in mass.

In a second aspect, the present invention provides a solid state material having one or more protrusions formed on an outer surface of a polished facet of the solid state material, wherein said one or more protrusions are formed from a method including the step of:

(i) applying focused inert gas ion beam local irradiation towards an outer surface of a polished facet of a solid state material in a way of protruding top surface material;

wherein irradiated focused inert gas ions from said focused inert gas ion beam penetrate the outer surface of said polished facet of said solid state material; and wherein irradiated focused inert gas ions cause expansive strain within the solid state crystal lattice of the solid state material below said outer surface at a pressure so as to induce expansion of solid state crystal lattice, and form a protrusion on the outer surface of the polished facet of said solid state material.

Preferably, the focused inert gas ion beam has a beam energy in the range of from 5 keV to 50 keV and probe current in the range of 1 fA to 200 pA.

The solid state crystal lattice may be in a form of single crystalline, poly-crystalline, or amorphous form. The solid state material is a material in solid state form under ambient temperature and under a pressure from atmospheric to high vacuum.

The solid state material is preferably a precious stone, and more preferably selected from the group including Diamond, Ruby, Sapphire, Emerald, Pearl, Jade or the like.

The focused inert gas ion beam utilised to form said one or more protrusions is an ion source which may be selected from any inert gas in Group VIII of the periodic table.

Preferably, the polished facet of the solid state material has an average surface roughness of less than 50 nm.

The protrusion preferably has an average width in the nanometer or micrometer order of magnitude, and an average height in the nanometer or micrometer order of magnitude.

Preferably, the distance from the outer surface of said solid state material to the region of irradiated inert gas accumulation below the outer surface is in the range of from 1 nm to 100 μm.

The one or more protrusions are preferably provided so as to form an identifiable mark or pattern. The identifiable mark may be in a form of single or array of dot, pillar, dome, hemisphere, line, irregular shape, symmetric or asymmetric shape, or the like.

Alternatively, the identifiable mark may be provided as a periodic line array, hole/dot array, circular array, spiral array, fractal array or multiple periods array, or the like, or the identifiable mark may be provided as a continuous protruded shape to form arbitrary patterns.

The solid state material may have a plurality of protrusions formed which are nanometer sized so as to provide an information mark invisible to the naked eye due to Rayleigh Criterion in optical limit. The protrusions may be arranged in a periodic array viewable by specified lighting conditions and by a camera equipped microscope in the visible and invisible light range.

The one or more protrusions may form an identifiable security mark.

The integrity of solid state material is preserved such that during formation of the one or more protrusions, there exists substantially no loss in mass of the solid state material.

In a third aspect, the present invention provides a system for forming one or more protrusions on an outer surface of a polished facet of a solid state material, said system including:

a focused inert gas ion beam device for applying focused inert gas ion beam local irradiation towards an outer surface of a polished facet of a solid state material a computer control device for controlling discharge of a focused inert gas ion beam local irradiation towards an outer surface of a polished facet of a solid state material, wherein the computer control device controls irradiated focused inert gas ions from said focused inert gas ion beam so as to penetrate the outer surface of said polished facet of said solid state material; and irradiated focused inert gas ions cause expansive strain within the solid state crystal lattice of the solid state material below said outer surface at a pressure so as to induce expansion of solid state crystal lattice, and so as to form a protrusion on the outer surface of the polished facet of said solid state material.

Preferably, the focused inert gas ion beam device has a beam energy in the range of from 5 keV to 50 keV and probe current in the range of 1 fA to 200 pA.

The focused inert gas ion beam utilised to form said one or more protrusions is an ion source which may be selected from any inert gas in Group VIII of the periodic table.

The system provides a protrusion having an average width in the nanometer or micrometer order of magnitude, and an average height in the nanometer or micrometer order of magnitude.

Preferably, the system is adapted to provide a protrusion whereby the distance from the outer surface of said solid state material to the region of irradiated inert gas accumulation below the outer surface is in the range of from 1 nm to 100 μm.

The system is adapted so as to provide an identifiable mark or pattern on an outer surface of a polished facet of a solid state material. The identifiable mark provided by the system may be in a form of a single or array of dot, pillar, dome, hemisphere, line, irregular shape, symmetric or asymmetric shape, or the like.

Alternatively, the identifiable mark may be provided as a periodic line array, hole/dot array, circular array, spiral array, fractal array or multiple periods array, or the like. The identifiable mark may be provided as a continuous protruded shape to form arbitrary patterns.

Preferably, the system is adapted to provide a plurality of protrusions which are nanometer sized so as to provide an information mark invisible to the naked eye due to Rayleigh Criterion in optical limit.

The system is preferably adapted so as to provide a plurality of protrusions which are arranged in a periodic array viewable by specified lighting conditions and by a camera equipped microscope in the visible and invisible light range.

The system may be adapted to provide one or more protrusions so as to form an identifiable security mark.

The system is adapted so as to maintain the integrity of said solid state material during formation of the one or more protrusions, and such that there exists substantially no loss in mass of the solid state material.

Preferably, the system is adapted so as to provide one or more protrusions on the outer surface of a precious stone. More preferably, the system is adapted so as to provide one or more protrusions on the outer surface of a Diamond, Ruby, Sapphire, Emerald, Pearl, Jade or the like.

The system is preferably adapted so as to provide one or more protrusions on a polished facet of the solid state material having an average surface roughness of less than 50 nm.

The system is preferably adapted so as to provide one or more protrusions on the outer surface of a solid state material, wherein the one or more protrusions has an average width in the nanometer or micrometer order of magnitude, and an average height in the nanometer or micrometer order of magnitude.

Preferably, the system is adapted so as to provide one or more protrusions on the outer surface of a solid state material such that the region of irradiated inert gas accumulation below the outer surface is in the range of from 1 nm to 100 μm.

BRIEF DESCRIPTION OF THE DRAWINGS

Preferred embodiments of the present invention will be explained in further detail below by way of examples and with reference to the accompanying drawings, in which.

DETAILED DESCRIPTION OF THE PREFERRED EMBODIMENTS

Figure 1:
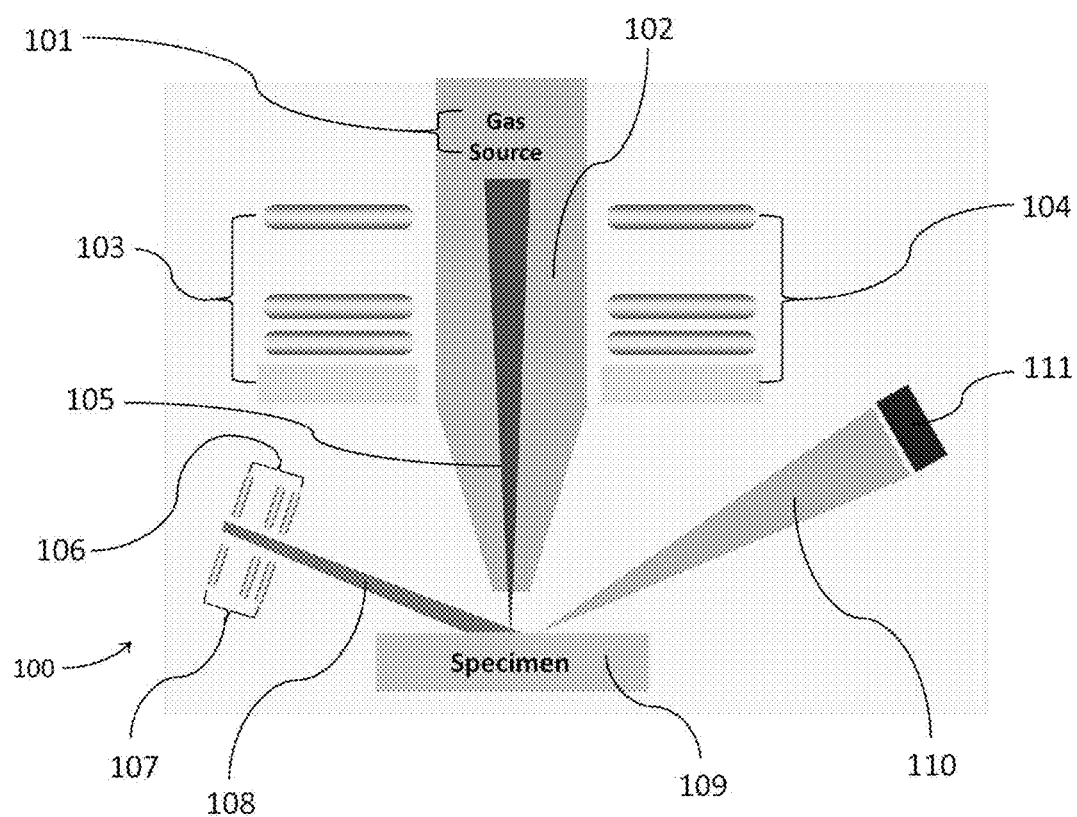
FIG. 1 shows an exemplary schematic diagram of a configuration of a focused inert gas ion beam system as utilised in embodiments of the present invention.

Referring to FIG. 1, there is shown an exemplary schematic diagram of a configuration of a focused inert gas ion beam system 100 as utilised in accordance with embodiments of the marking method of the present invention.

In comparison to typical scanning electron microscopy (SEM), the focused inert gas ion beam system 100 has a similar basic configuration, whereby the schematic diagram of FIG. 1 shows the configuration of a focused inert gas ion beam system 100 for producing and imaging the protruded array of nanometer sized dots in accordance with embodiments of the present invention is shown.

The gas sources 101 at the top of the electrostatic lens column 102 may be any known inert gases in Group VIII of the periodic table, and the choice of inert gas sources utilised depends on the requisite resulting resolution and fabrication time. Further, an inert gas is preferably utilised in order to minimise any alterations in electrical, optical, or chemical properties of a specimen to be marked.

For example, for the fabrication of protruded nanometer sized dots is shown and discussed further below in reference to FIG. 4, FIG. 5 and FIG. 6, a low pressure of the inert gas with light atomic mass is preferred, such as Helium or Neon gas for the gas source 101 of the focused inert gas ion beam system 100.

Once the inert gas ion is emitted from the gas source 101, it is accelerated and focused along the top of the electrostatic lens column 102, and then deflected by scanning deflectors 103 and 104 which are controlled by a computer system, typically a mainframe computer control system or the like, which finally forms a scanning focused inert gas ion beam 105 to incident on surface of a specimen 109.

During the scanning or continuous incident of the focused inert gas ion beam 105 to incident on surface of the specimen 109, a beam 108 of electrons or negative charges emitted from an emission device 106 and 107, such as electron flood gun or charge compensator, is used to compensate the positively charged up specimen surface 109 due to continuous incident of gas ions on specimen surface 109.

As the charged up ions inhibit further incident of focused inert gas ions 105, this results in image burr or drift in position or shape of a requisite protruded mark.

During incident of the focused inert gas ion beam 105 on the surface of the specimen 109, the interaction of incident inert gas ions with the surface of the specimen 109 produces different charged species 110 such as electrons or ions which are detected by an ion or electron detector 111 for imaging, species qualification and quantification.

Figure 2:
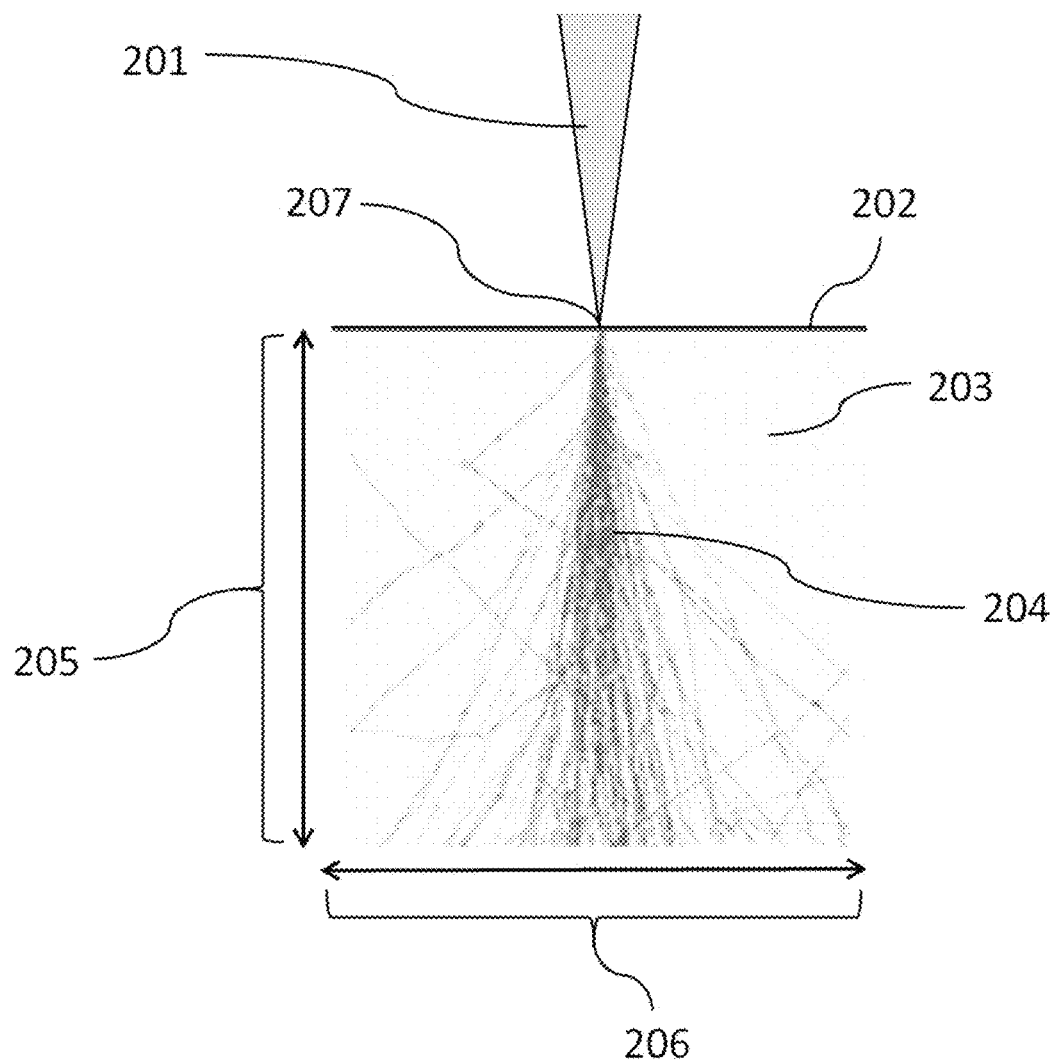
FIG. 2 shows an exemplary schematic representation of a computer stimulated interaction volume of incident energetic focused inert gas ions with a solid state material specimen at a top surface region, in accordance with embodiments of the present invention.

Referring to FIG. 2, there is shown an exemplary schematic representation of a computer simulated interaction volume of incident energetic focused inert gas ions with a solid state material specimen 203 at a top surface region, 202 in accordance with the present invention, whereby an example of the computer simulated Monte Carlo plot is depicted showing of the trajectory of the incident ions 204 during the interaction of an incident energetic focused inert gas ion beam 201 with a top surface region 202 of a solid state material specimen 203.

The Monte Carlo simulation of the interaction is based upon Helium ion as the source of incident energetic focused inert gas ion beam 201 which is accelerated at 30 keV and the solid state material specimen 203 is silicon substrate.

The cross-section of interaction volume of the solid state material specimen 203 is defined with the penetration depth 205 and dispersed width 206 which is perpendicular to penetration depth 205 of incident ions, and the Monte Carlo simulated numerical results of the penetration depth 205 and dispersed width 206 is about 100 nm. Further, due to a high penetration depth and less lateral straggle of Helium gas ion into the silicon substrate, the size of the focused ion beam spot 207 at the top surface region 202, in range of 10 nm, is as small as 1 nm or less in order to fulfill the requisite criteria of embodiments of the present invention in creating requisite nanometer sized structures or marks.

Figure 3:
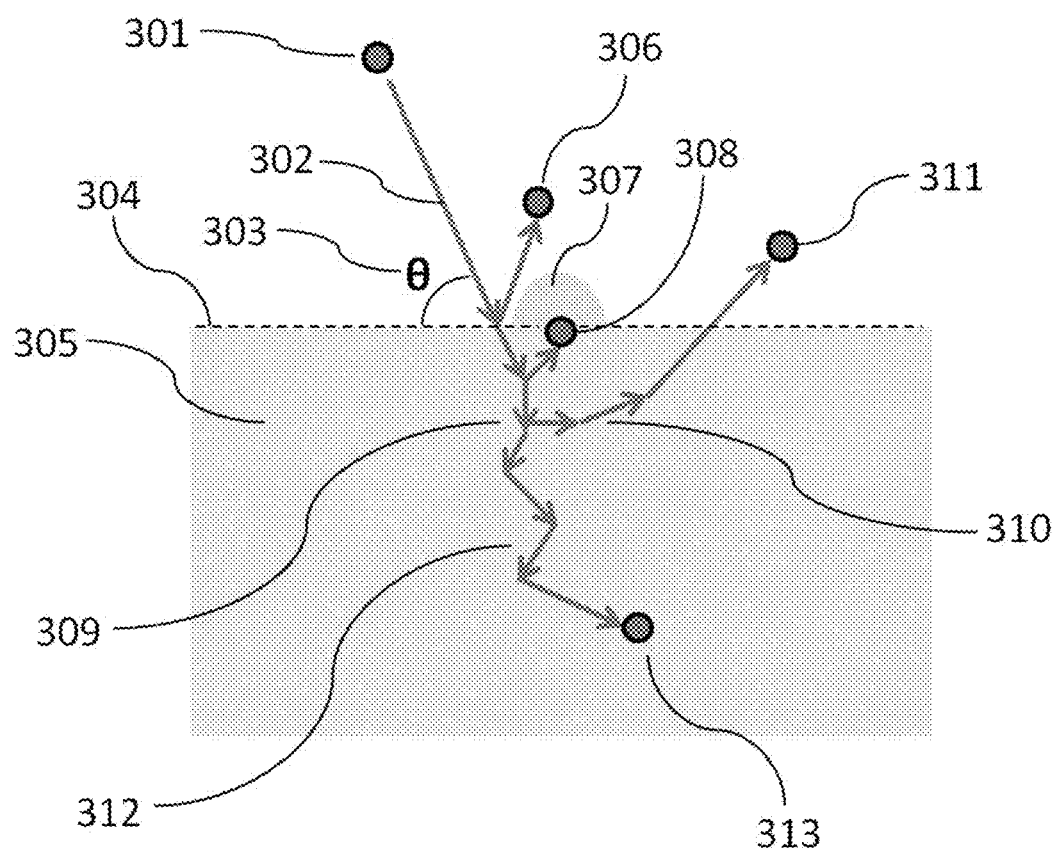
FIG. 3 shows an exemplary schematic representation depicting interaction of primary incident energetic inert gas ion with a solid state specimen, the Figure showing the production of charged particles such as electrons and ions along the displaced path of incident ion, in accordance with embodiments of the present invention.

Referring to FIG. 3, the detailed interaction of incident energetic inert gas ion 301 with a solid state material 305 as utilised in accordance with embodiments of the present invention is schematically shown.

For explanatory purposes of embodiments of the present invention, the experimental environment is assumed to be in high vacuum, such as at pressure of $5 \times 10^{-6}$ Torr or lower pressure, and the energetic inert gas ion 301 incident along the path 302 is at an incident angle 303 to the surface or interface 304 between vacuum and the solid state specimen 305.

At the instance of energetic inert gas ion 301 incident at the specimen surface or interface 304, possible energetic species 306 may be generated such as secondary electrons, Auger electrons, X-ray, secondary ions, sputtered particles from the solid state specimen 305, or even back-scattered energetic inert gas ion 301.

The circumstance of said possible energetic species depends on the atomic mass and carried energy of energetic inert gas ion 301, density and crystallinity of the solid state specimen 305, chemical bonding between atoms, and the charge state of the specimen surface or interface 304.

If the energetic inert gas ion 301 has sufficient energy, then there exists a high probability of entry of said energetic species into the solid state specimen 305 and continued to penetration.

Along the propagation paths 309 and 312, the energetic inert gas ion 301 may possibly undergo inelastic collision with adjacent atoms inside the solid state specimen 305, and one possibility is the generation of energetic species 311 such as secondary ion or secondary electron and possibly coming along the path 310 out from the specimen surface or interface 304.

Another possibility is for said possible energetic species to stop at certain local regions for example 308 and 313 as depicted inside the solid state specimen 305 due to energy loss as resulting in accumulation of inert gas ion or amorphisation of crystalline at local regions 308 and 313.

By appropriate control of the condition of the incident angle 303 of the energetic inert gas ion 301, accelerating voltage, and species selection of energetic inert gas ion 301, the incident energetic inert gas ion 301 has high probability to stop at region 308 and result in either or both accumulation of inert gas ion or amorphisation of crystalline at local region which has lower density but larger volume than crystalline structure.

Thus, local internal strain is built up within the solid state specimen 305 slightly below the specimen surface or interface 304 which finally leads to expansion of solid state crystalloid lattice at the specimen surface or interface 304, hence resulting in the formation of a protruded dot 307 in accordance with embodiments of the present invention.

Figure 4:
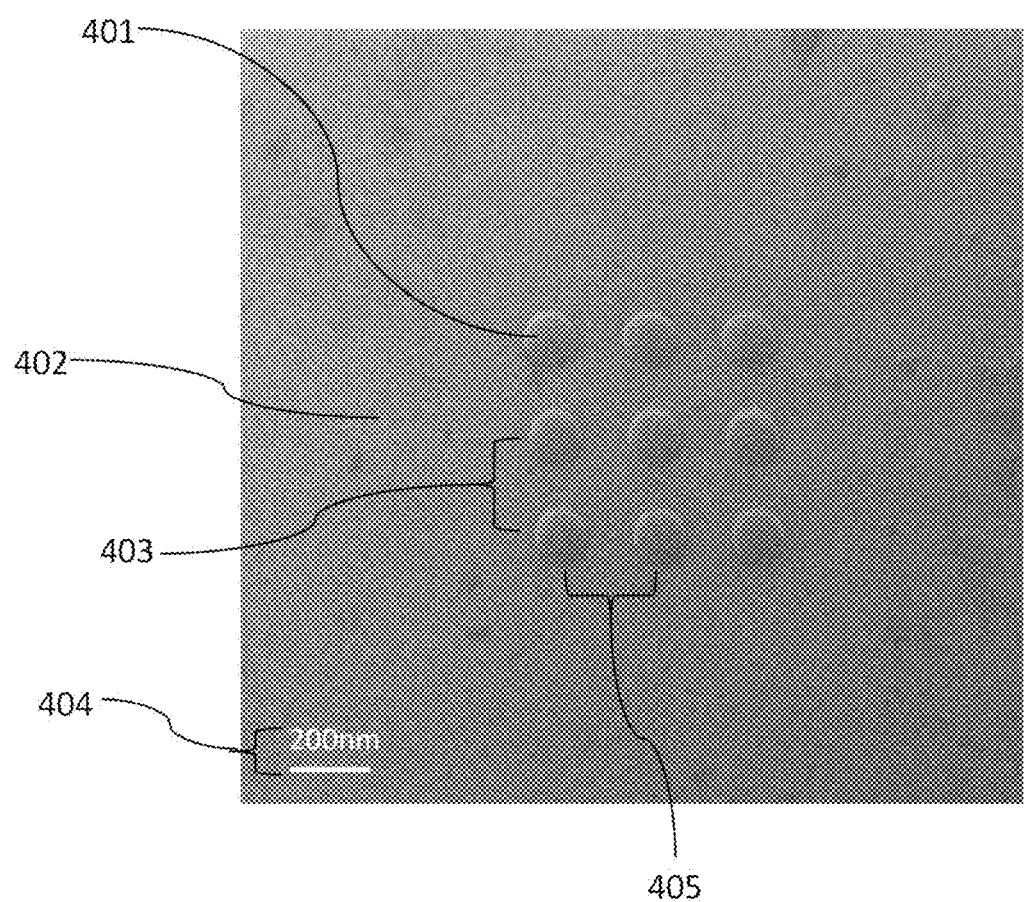
FIG. 4 depicts an ion microscope image of an experimentally protruded array of nanometer sized dots, in accordance with embodiments of the present invention.

Referring to the ion microscope image as depicted in FIG. 4, there is shown an experimentally protruded array of nanometer sized dots 401 on single crystal diamond facet 402 by the focused inert gas ion beam system.

The acceleration voltage of gas ions utilised is about 35 kV, and the beam current utilised is about 0.5 pA with ions dose of about 0.1 nC/$\mu m^2$, and the dwell time is of about 1 us. As will be understood, other applicable acceleration voltages and beam currents may be utilised, whilst falling within the scope of the present invention. For example, a focused inert gas ion beam device utilising focused inert gas ion beam having a beam energy in the range of from 5 keV to 50 keV and probe current in the range of 1 fA to 200 pA, will be understood to be applicable, although utilizing equipment capable of generating parameters outside of 5 keV to 50 keV and probe current in the range of 1 fA to 200 pA, may also be considered by those skilled in the art to be applicable to embodiments of the present invention.

The incident position of the focused inert gas ion beam is programmed by the computer and then controlled by scanning lens column 103 and 104 as exemplified and described with to FIG. 1, and as results as shown in FIG. 4, the array of 3×3 protruded nanometer sized dots is formed with each protruded nanometer sized dots 401 having diameter of about 130 nm and the vertical period 403 and horizontal period 405 with reference to the plane of the diamond facet 402, displacement between centers of adjacent protruded nanometer sized dots 401, are same of about 200 nm.

The field of view of whole image in this example as shown in both vertical and horizontal directions is 2.00 µm×2.00 µm under magnification of 57,150×, which in this example is imaged by the same focused inert gas ion beam system after fabrication of protruded nanometer sized dots 401, and with the same acceleration voltage of gas ions but less beam current than under scanning mode.

The scale bar 404 is shown for reference to the dimension of the protruded nanometer sized dots 401.

Figure 5:
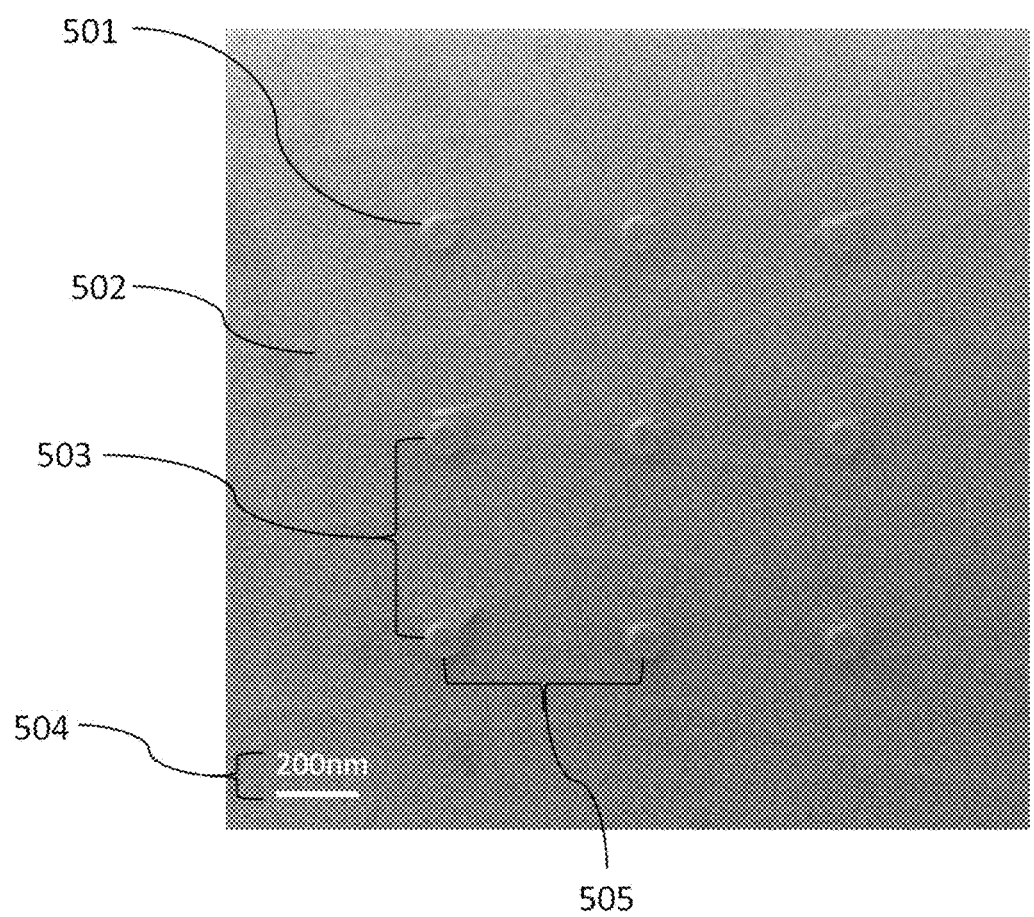
FIG. 5 depicts an ion microscope image of a further experimentally protruded array of nanometer sized dots, in accordance with embodiments of the present invention.

Similarly to FIG. 4, FIG. 5 shows an exemplary embodiment of a protruded array of nanometer sized dots 501 fabricated by the focused inert gas ion beam system on single crystal diamond facet 502, however the diameter of the protruded nanometer sized dots 501 in this example is reduced to 80 nm and both the vertical period 503, and the horizontal period 505 is increased to 400 nm.

The reduction of the protruded nanometer sized dots 501 diameter is achieved by reducing the inert gas ions dose to less than 0.05 nC/$\mu m^2$ and also reducing the beam current to less than 0.5 pA.

The imaging conditions of FIG. 5 are the same as set in FIG. 4 with the scale bar 505 for reference.

Figure 6:
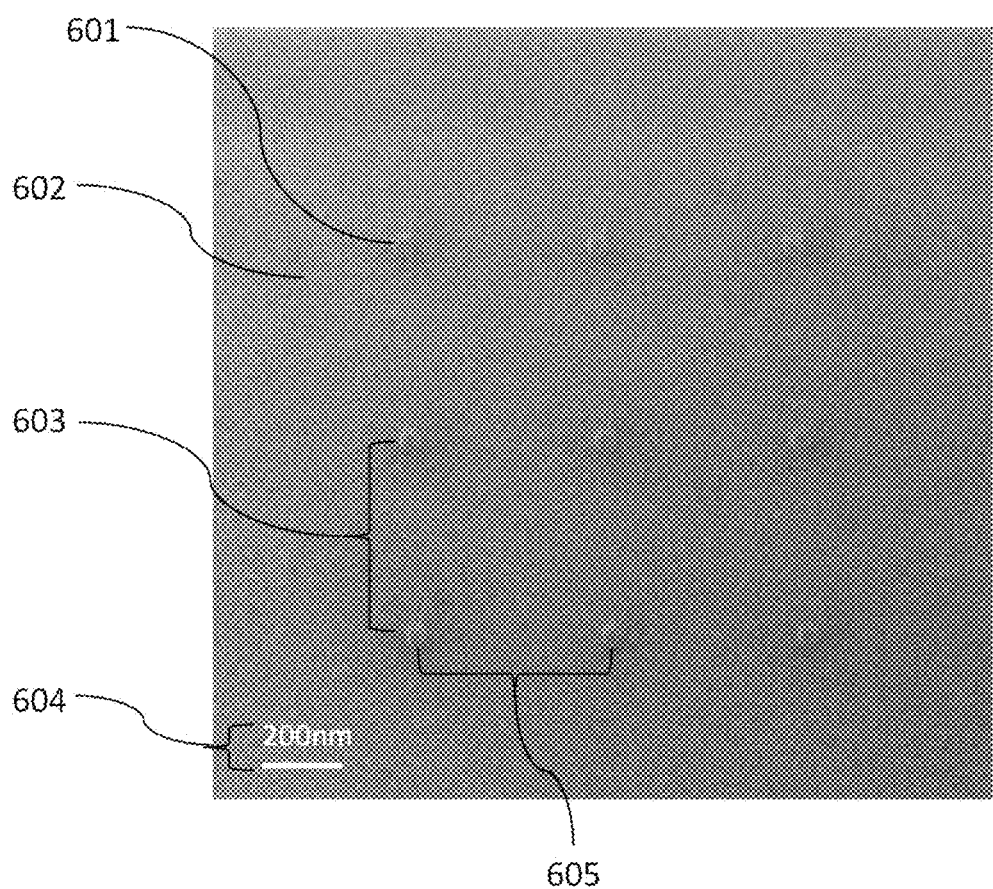
FIG. 6 depicts an ion microscope image of another experimentally protruded array of nanometer sized dots, in accordance with embodiments of the present invention.

By way of a further exemplary embodiment, further reducing the inert gas ions dose, for example to 0.03 nC/$\mu m^2$ or less, and also further reducing the beam current to 0.4 pA or less, the diameter of the protruded nanometer sized dots 601 is reduced to 50 nm fabricated on single crystal diamond facet 602 as shown in FIG. 6.

The array of protruded nanometer sized dots 601 has both the same vertical period 603 and horizontal period 605 as shown in FIG. 5 with a similar scale bar 604 for reference and comparative purposes.

As will be understood and appreciated by those skilled in the art, the exemplary embodiments as described with reference to FIG. 4, FIG. 5, and FIG. 6 show that the diameter of protruded nanometer sized dots can be controlled by appropriately tuning the incident gas ions dose and the probe current, hence the beam size of incident gas ions, from diameter of 200 nm shown in FIG. 4, to a significantly lower size down to 50 nm shown in FIG. 6.

Furthermore, the change of the both vertical and horizontal periods in the protruded array of nanometer sized dots from 200 nm as shown in FIG. 4 to 400 nm as shown in both FIG. 5, and FIG. 6, indicate that the focused inert gas ion beam has the ability and efficacy to be utilised to fabricate those protruded nanometer sized dots at arbitrary positions on a specimen surface as a result of a protruded mark in a form of a single or array of dot, pillar, dome, hemisphere, line, irregular shape, symmetric or asymmetric shape, or arbitrary shape which is in periodic line array, hole/dot array, circular array, spiral array, fractal array or multiple periods array, by way of example.

Figures 7A, 7B:
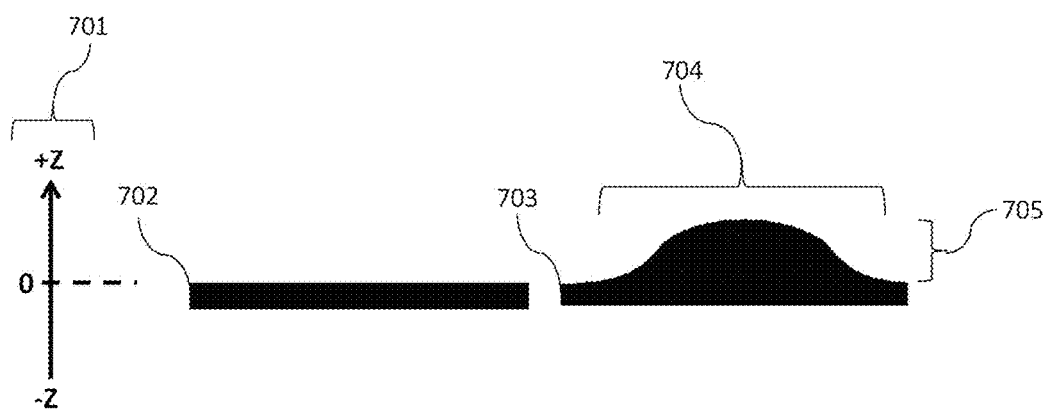
FIG. 7a depicts a graph showing a schematic representation of a surface profile of an untreated flat surface.
FIG. 7b depicts a graph of a schematic representation of the profile of protruded surface according to embodiments of the present invention.

Reference is made to FIGS. 7a and 7b, in order to further explain the geometry of the protruded nanometer sized dots, whereby a schematic graph shows the cross-sections between the surface profiles of untreated flat specimen surface 702 and the protruded surface 703 with nanometer sized dots.

With reference to the Z-direction axis 701, the untreated flat surface 702 of FIG. 7a is at the level of Z=0 whilst the protruded surface 703 of FIG. 7b is deformed to the positive sign of Z-direction, thus having a profile higher than the untreated flat surface 702.

Further space upper than the untreated flat surface 702 or the protruded surface 703 may be exposed to air/vacuum in the positive sign of Z-direction axis, whilst in the negative side of Z-direction the specimen depth may be finite or semi-infinite.

The height 705 of the protruded surface 703 is defined as being from the displacement of the protruded surface 703 top from Z=0 while the width or diameter 704 of the protruded surface 703 or dot is defined as the greatest displacement between two lowest points in the surface profile of the protruded surface 703 just above Z=0.

Figure 8:
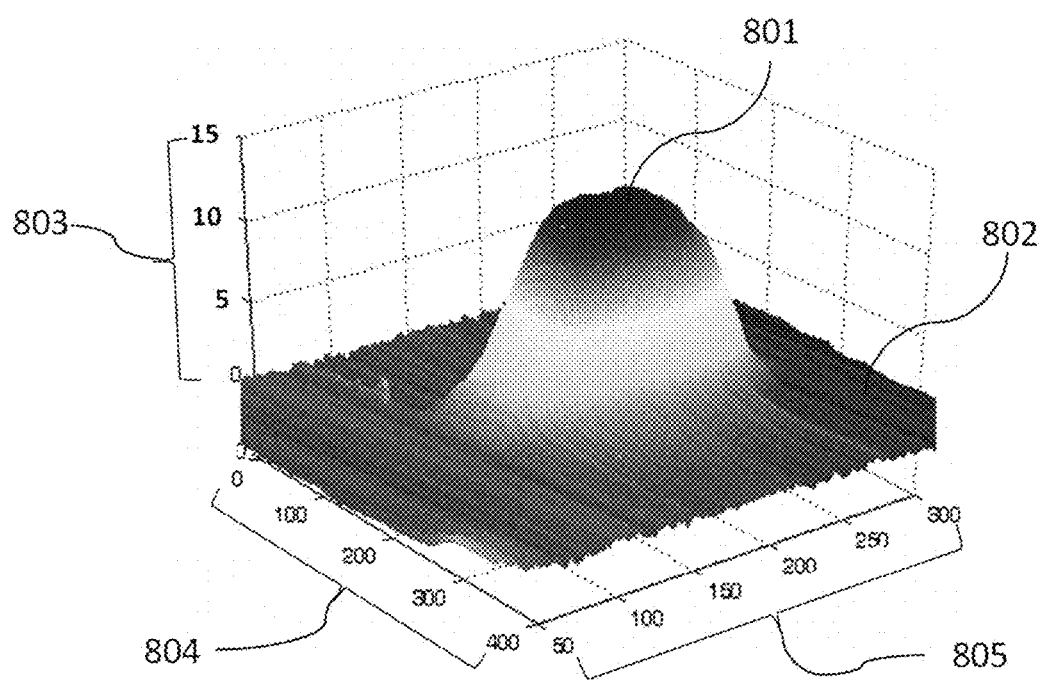
FIG. 8 depicts a schematic three-dimensional contour representation of a protruded surface profile on a flat surface with proportional dimensions in reference to the experimental results as described with reference to FIGS. 4, 5 and 6.

Referring to FIG. 8, there is shown an example of schematic three-dimensional contour diagram of a protruded mark 801 profile so as to provide for enhanced illustration, appreciation and understanding of the shape of the protruded mark 801 fabricated on flat surface 802 by focused inert gas ion beam.

The height of the protruded mark, has the same definition as 705 explained and discussed in reference to FIG. 7b, whereby the protruded mark 801 extends from the flat surface 802 in reference to axis 803, while the width and depth have the same definition as 704 as explained and described in reference to FIG. 7a and FIG. 7b, of the protruded mark 801 are in reference to 804 and 805 respectively.

In reference to the illustrative example of FIG. 8 to those protruded nanometer sized dots shown in FIG. 4, FIG. 5 and FIG. 6, the dimension units of all axes 803, 804 and 805 are in nanometers.

Figure 9A:
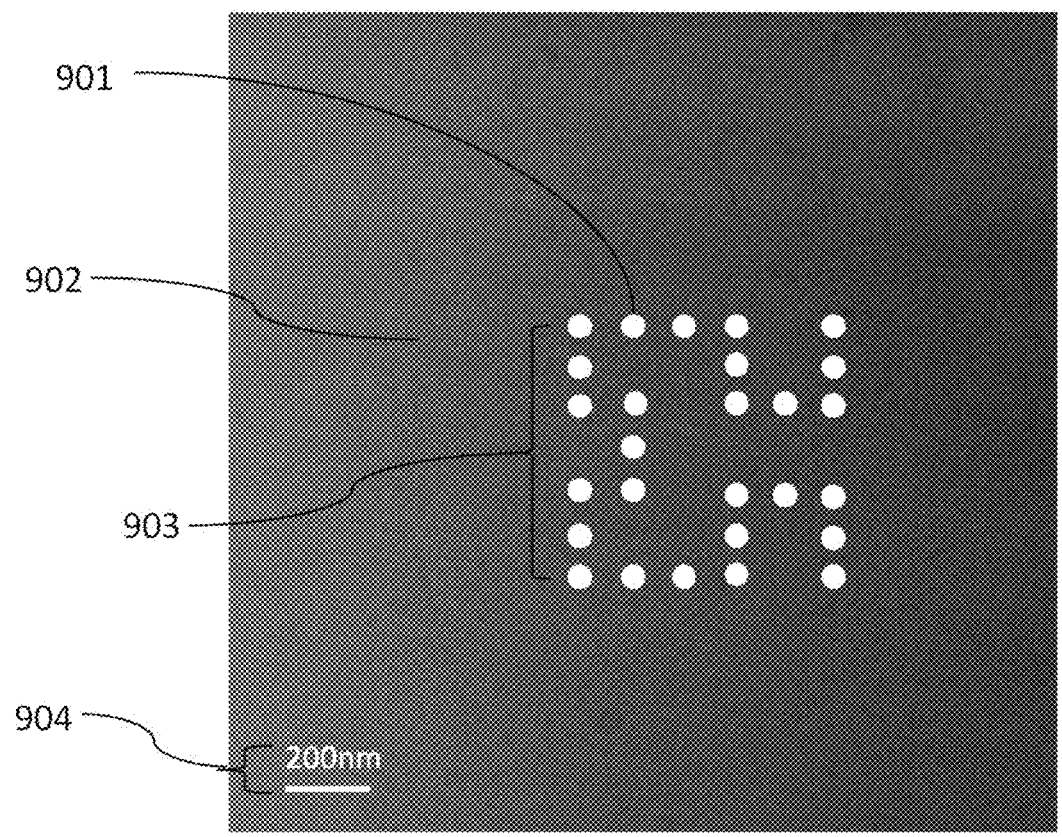
FIG. 9a depicts an ion microscope image of an untreated surface on a single crystal diamond facet with a programmed dot array to be incident by focused inert gas ion beam in accordance with embodiments of the present invention.
Figure 9B:
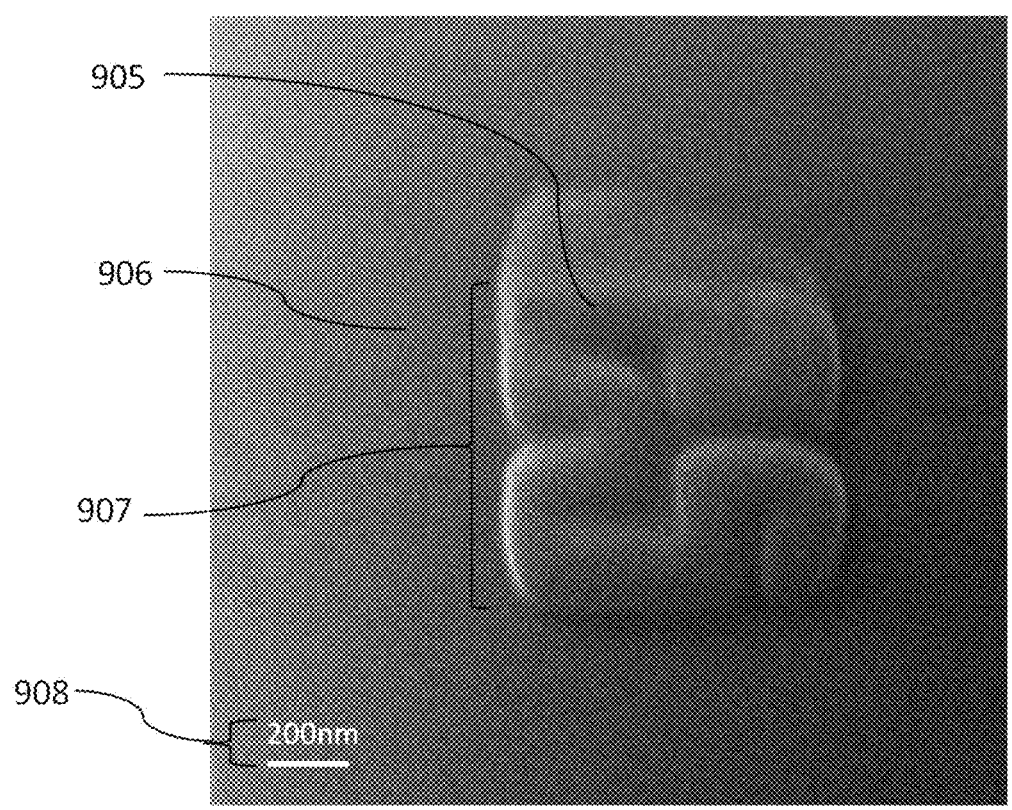
FIG. 9b depicts an ion microscope image of the surface of the single crystal diamond facet of FIG. 9a, after incident by focused inert gas ion beam at assigned position on the diamond specimen surface, in accordance with embodiments of the present invention.

Referring to the ion microscope images shown in FIG. 9a and FIG. 9b, an exemplary embodiment of the invention is shown whereby the feasibility is demonstrated of fabricating a predetermined and designed nanometer sized continue pattern or mark 905 on single crystal diamond facet 902 and 906 by a programmed array 903, whereby the energetic inert gas ion incident at which is shown as white dots 901. The displacement between centers of adjacent white dots 901 is about 120 nm with reference to the scale bar 904.

By controlling the dose and beam current of the incident energetic inert gas ions, in order to achieve each protruded nanometer sized dot having a diameter of not less than 120 nm, a continued protruded line 905 and further a two-dimensional protruded pattern or mark 907 on facet 906 with a size of around 800 nm×800 nm, with reference to the scale bar 908, instead of discrete dots has been formed as shown in FIG. 9b.

Those skilled in the art will appreciate that the present invention allows for the provision of numerous other and alternate embodiments utilising the methodology and process of the present invention, so as to provide marking to a solid state material in a predetermined manner, for a variety of applications depending upon the requirements of such applications.

The present invention provides a method and system for the application of a marking to a solid state material and a marked solid state material resulting therefrom, preferably a precious stone, which provides marking having the advantages including those of the following:

(i) marking which is not unsightly and which may not be readily viewed without the knowledge of specific parameters for the viewing and identification of such marking;

(ii) marking, which when applied to precious stones or gemstones, allows for identification for security purposes, as well as tracking and origin purchases, benefits and advantages in the precious stone industry;

(iii) security purposes for marking of solid state materials which may be identified in the event of impropriety, theft or the like;

(iv) marking of a solid state material, without the disadvantages associated with destructive and invasive methods of marking such as etching, ablation, millings, engravings or the like;

(v) a methodology and product thereof which does not result in removal of material or any significant loss in weight or mass of the solid state material to which the marking is to be applied;

(vi) a methodology and product thereof which does not alter the optical properties of a solid state material, and which does not detrimentally affect the clarity or colour of the solid state material;

(vii) a methodology and product thereof which utilises an inert gas, and does not introduce contaminants or impurities to the solid state material;

(viii) a methodology and product thereof which obviates the necessity of post-processing of the solid state material;

(ix) a methodology and product thereof that requires no significant removal of material from the surface of solid state material;

(x) a methodology and product thereof which obviates the necessity of pre-treatment of coating of the solid state material prior to application of marking;

(xi) a methodology and product thereof, having no associated chemical residue;

(xii) a methodology and product thereof which obviates the necessity of post-processing and the utilisation of complex post-processing techniques such as chemical and plasma cleaning and the like.

By providing a method of marking a surface of solid state material by applying focused inert gas ion beam local irradiation in a way of protruding up a top surface of a material to form patterns or marks, due to expansion of solid state crystalloid lattice underneath its top surface by the force of inert gas accumulation or amorphisation of crystalline underneath, instead of etching, engraving, milling or removing top surface material, which are concerned as destructive and invasive and ablative to the solid state material, the present invention provides significant advantages over those of the prior art.

Those skilled in the art will appreciate the advantages associated with such a marking technique and methodology for solid state material which may be utilised and implemented in other applications in addition to those as described in the exemplary embodiments and examples thereof.

While the present invention has been explained by reference to the examples or preferred embodiments described above, it will be appreciated that those are examples to assist understanding of the present invention and are not meant to be restrictive. Variations or modifications which are obvious or trivial to persons skilled in the art, as well as improvements made thereon, should be considered as equivalents of this invention.

What is claimed is:

1. A method of forming one or more protrusions on an outer surface of a polished facet of a solid state material, said method including the step of:

(i) applying focused inert gas ion beam local irradiation towards an outer surface of a polished facet of a solid state material so as to form a protrusion extending outwardly from the outer surface of said polished facet; wherein irradiated focused inert gas ions from said focused inert gas ion beam penetrate the outer surface of said polished facet of said solid state material; and wherein irradiated focused inert gas ions cause expansive strain within the solid state crystal lattice of the solid state material below said outer surface at a pressure so as to induce expansion of solid state crystal lattice, and form said protrusion on the outer surface of the polished facet of said solid state material.

2. A method of forming one or more protrusions according to claim 1, wherein said focused inert gas ion beam has a beam energy in the range of from 5 keV to 50 keV and probe current in the range of 1 fA to 200 pA.

3. A method of forming one or more protrusions according to claim 1, wherein the solid state crystal lattice is in a form of a single crystalline, or poly-crystalline form.

4. A method of forming one or more protrusions according to claim 1, wherein the solid state material is a material in solid state form under ambient temperature and under a pressure from atmospheric to high vacuum of about 0.67 millipascal (mPa).

5. A method of forming one or more protrusions according to claim 1, wherein the solid state material is selected from the group consisting of Diamond, Ruby, Sapphire, Emerald, Pearl, and Jade.

6. A method of forming one or more protrusions according to claim 1, wherein the focused inert gas ion beam is an ion source from any inert gas in Group VIII of the periodic table.

7. A method of forming one or more protrusions according to claim 1, wherein the polished facet of the solid state material has an average surface roughness of less than 50 nm.

8. A method of forming one or more protrusions according to claim 1, wherein said protrusion has an average width within the nanometer or micrometer order of magnitude, and an average height within the nanometer or micrometer order of magnitude.

9. A method of forming one or more protrusions according to claim 1, wherein the distance from the outer surface of said solid state material to the region of irradiated inert gas accumulation below the outer surface is in the range of from 1 nm to 100 μm.

10. A method of forming one or more protrusions according to claim 1, wherein said one or more protrusions is provided so as to form an identifiable mark or pattern.

11. A method of forming one or more protrusions according to claim 10, wherein the identifiable mark is in a form of a single or array of dot, pillar, dome, hemisphere, line, symmetric or asymmetric shape, wherein the identifiable mark may be provided as a periodic line array, hole/dot array, circular array, spiral array, fractal array or multiple periods array.

12. A method of forming one of more protrusions according to claim 10, wherein the identifiable mark is provided as a continuous protruded shape to form arbitrary patterns.

13. A method of forming one or more protrusions according to claim 1, wherein a plurality of protrusions are formed and are sized in the nanometer or micrometer order of magnitude so as to provide an information mark invisible to the naked eye due to Rayleigh Criterion in optical limit.

14. A method of forming one or more protrusions according to claim 13, wherein said protrusions are arranged in a periodic array viewable by specified lighting conditions and by a camera equipped microscope in the visible and invisible light range.

15. A method of forming one or more protrusions according to claim 1, wherein said one or more protrusions forms an identifiable security mark.

16. A method of forming one or more protrusions according to claim 1, wherein there exists substantially no loss in mass of the solid state material.

* * * * *